(12) United States Patent
Katayama et al.

(10) Patent No.: US 9,859,738 B2
(45) Date of Patent: Jan. 2, 2018

(54) BATTERY SYSTEM CONTROLLER

(71) Applicant: DENSO CORPORATION, Kariya, Aichi-pref. (JP)

(72) Inventors: Naoki Katayama, Kariya (JP); Shigenori Saito, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 129 days.

(21) Appl. No.: 13/939,568

(22) Filed: Jul. 11, 2013

(65) Prior Publication Data
US 2014/0015534 A1 Jan. 16, 2014

(30) Foreign Application Priority Data
Jul. 11, 2012 (JP) ................................. 2012-155287

(51) Int. Cl.
*H02J 7/00* (2006.01)
*G01R 31/36* (2006.01)
*H01M 10/42* (2006.01)

(52) U.S. Cl.
CPC ............ *H02J 7/007* (2013.01); *H02J 7/0077* (2013.01); *G01R 31/3662* (2013.01); *H01M 10/4207* (2013.01)

(58) Field of Classification Search
USPC ........................................................ 320/104
See application file for complete search history.

(56) References Cited

U.S. PATENT DOCUMENTS

| 5,028,860 A * | 7/1991 | Amano ......................... 320/164 |
| 2008/0122399 A1* | 5/2008 | Nishino ................ H02J 7/0075 320/103 |
| 2011/0001352 A1* | 1/2011 | Tamura et al. ................. 307/9.1 |

FOREIGN PATENT DOCUMENTS

| CN | 101944756 A | 1/2011 |
| EP | 0 700 142 A1 | 3/1996 |
| EP | 0 724 321 A2 | 7/1996 |
| JP | A-2012-080706 | 4/2012 |

OTHER PUBLICATIONS

Dec. 23, 2015 Office Action issued in Chinese Patent Application No. 201310286576.4.

* cited by examiner

*Primary Examiner* — Samuel Berhanu
(74) *Attorney, Agent, or Firm* — Oliff PLC

(57) ABSTRACT

A battery system controller is provided which is used for a battery system including a generator, electrical loads, a lead storage battery, a high performance storage battery which has higher-power and higher-energy density, and an opening and closing switch which switches the generator and the lead storage battery, and the high performance storage battery to an electrically conducting state or an interrupted state, a terminal voltage of the high performance storage battery being controlled so as to be lower than a terminal voltage of the lead storage battery. The battery system controller includes a control unit which allows the opening and closing switch to switch from an electrically conducting state to an interrupted state on the condition that charging current flowing to the high performance storage battery is smaller than a determination value, the larger an internal resistance of the lead storage battery, the smaller the determination value is set.

16 Claims, 3 Drawing Sheets

BATTERY SYSTEM CONTROLLER

CROSS-REFERENCE TO RELATED APPLICATION

This application is based on and claims the benefit of priority from earlier Japanese Patent Application No. 2012-155287 filed Jul. 11, 2012, the description of which is incorporated herein by reference.

BACKGROUND

Technical Field

The present invention relates to a controller for a battery system including a generator, electrical loads, a lead storage battery, and a high performance storage battery.

Related Art

As described in JP-A-2012-80706, a battery system is proposed which includes a storage battery which is inexpensive but has lower durability under charge and discharge, and a high performance storage battery, which is expensive but has higher-power and higher-energy density and has higher durability under charge and discharge. The battery system is installed in a vehicle using an engine as a driving source.

In the battery system, a generator, electrical loads and a lead storage battery, and a high performance storage battery are electrically connected via a low-cost opening and closing switch. Operation of the opening and closing switch switches the generator, the electrical loads and the lead storage battery and the high performance storage battery to an electrically conducting state or an interrupted state, which appropriately use the two batteries.

However, if the generator, the electrical loads and the lead storage battery and the high performance storage battery are electrically connected by using the opening and closing switch, a large current easily flows from the generator or the lead storage battery to the high performance storage battery. In a state where a large current is flowing to the high performance storage battery, if the generator, the electrical loads and the lead storage battery and the high performance storage battery are interrupted, the large current is received by the lead storage battery, thereby rapidly increasing the terminal voltage of the lead storage battery. Specifically, if internal resistance of the lead storage battery is larger, the amount of increase of the terminal voltage of the lead storage battery increases. Hence, the terminal voltage of the lead storage battery can exceed withstand voltages of the electrical loads.

SUMMARY

An embodiment provides a battery system controller which is used in a battery system including a lead storage battery and a high performance storage battery which are electrically connected via an opening and closing switch, and which can restrain the amount of increase of a terminal voltage of a lead storage battery when interrupting between the lead storage battery and the high performance storage battery.

As an aspect of the embodiment, a battery system controller is provided which is used for a battery system including a generator which is driven by an engine to generate electricity, electrical loads which are connected to the generator in parallel, a lead storage battery which is connected to the generator in parallel so as to be charged with electric power generated by the generator, a high performance storage battery which has higher-power density and higher-energy density and is connected to the generator in parallel so as to be charged with electric power generated by the generator and electric power discharged from the lead storage battery, and an opening and closing switch which switches the generator and the lead storage battery, and the high performance storage battery to an electrically conducting state or an interrupted state, a terminal voltage of the high performance storage battery being controlled so as to be lower than a terminal voltage of the lead storage battery. The battery system controller includes a control unit which allows the opening and closing switch to switch from an electrically conducting state to an interrupted state on the condition that charging current flowing to the high performance storage battery is smaller than a determination value, and the larger an internal resistance of the lead storage battery, the smaller the determination value is set.

DETAILED DESCRIPTION OF THE PREFERRED EMBODIMENTS

With reference to the accompanying drawings, hereinafter are described embodiments of a battery system controller. A vehicle, in which the battery system of the present embodiment is installed, uses an engine as a driving source. The vehicle has an idle reduction function which automatically stops and restarts the engine if a predetermined condition for an automatic stop and an automatic restart is met.

Figure 1:
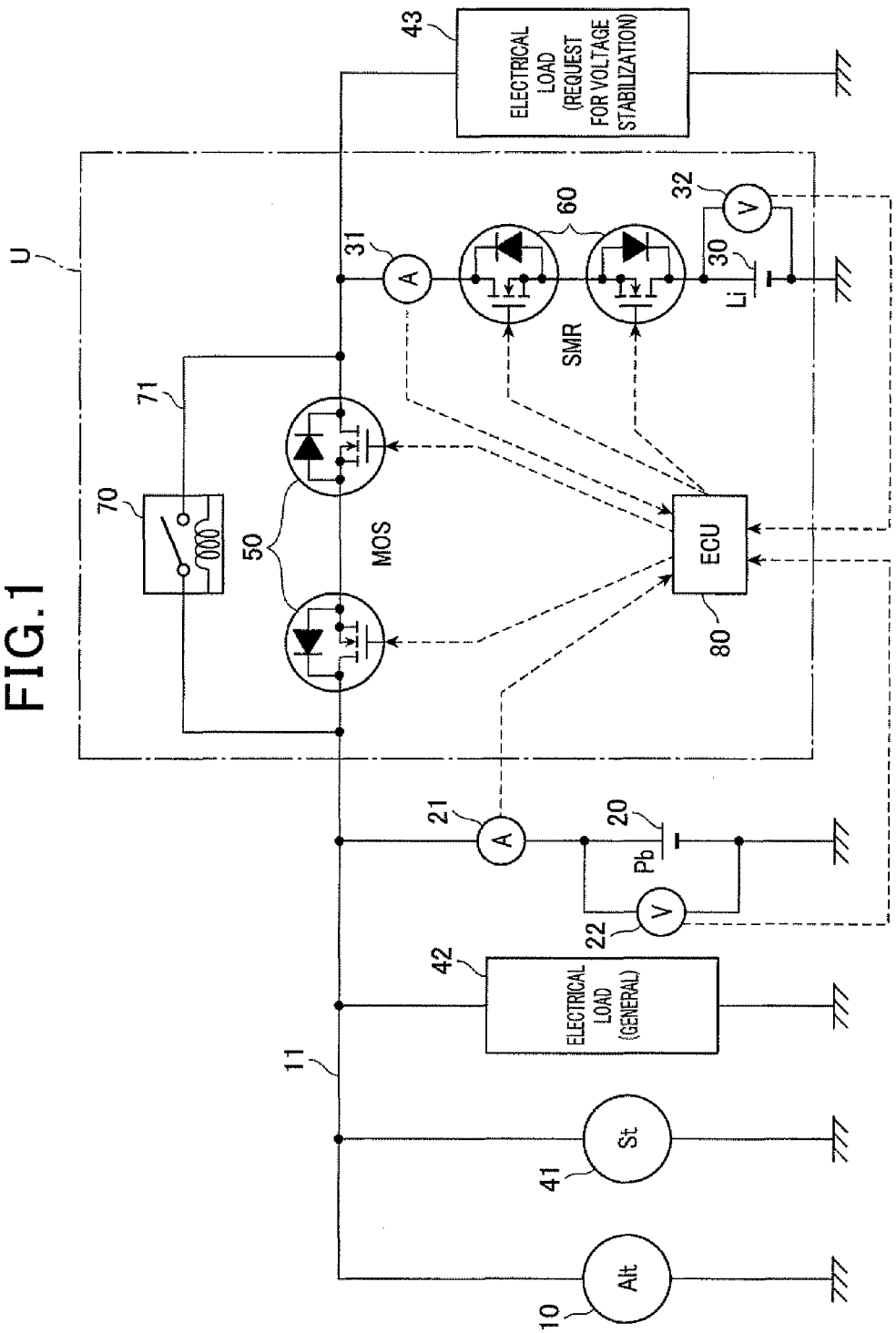
FIG. 1 is a schematic view showing a configuration of a battery system according to an embodiment.

FIG. 1 shows a battery system according to the present embodiment. The battery system includes an alternator 10 (generator), a lead storage battery 20, a lithium battery 30 (high performance storage battery), a starter motor 41, electrical loads 42, 43, and various switches which opens or doses a circuit to conduct or interrupt current. The switches include a MOS switch 50 (opening and closing switch), which is a semiconductor switch constituted of a MOSFET, an SMR (system main relay) switch 60, which is a semiconductor switch constituted of a MOSFET, and a relay switch 70.

The alternator 10, the lead storage battery 20, the starter motor 41, and the electrical load 42 are electrically connected to each other in parallel. In addition, the electrical load 43 is connected in parallel to a series connection of the SMR switch 60 and the lithium storage battery 30, which are electrically connected. The MOS switch 50 is connected between a set of the alternator 10, the lead storage battery 20, the starter motor 41 and the electrical load 42, and a set of the SMR switch 60 and the electrical load 43.

The alternator 10 is driven by rotational energy of a crankshaft to generate electricity. When a rotor of the alternator 10 is rotated via the crankshaft, an alternating current is induced in a stator coil depending on an excitation current flowing through the rotor coil. The induced alternating current is converted into a direct current by a rectifier. In addition, a regulator regulates the excitation current flowing through the rotor coil to make the voltage corresponding to the generated direct current a predetermined voltage Vreg. In addition, in the present embodiment, deceleration regeneration is performed which makes the alternator 10 generate electricity by using regeneration energy of the vehicle. The deceleration regeneration is performed when such a condition is met as that the vehicle is decelerating, and that fuel injection to the engine is stopped. The electric power generated by the alternator 10 is supplied to the electrical loads 42, 43 in addition to the lead storage battery 20 and the lithium storage battery 30.

The lead storage battery 20 is a known general-purpose storage battery. The lithium storage battery 30 is a high performance storage battery which has higher-power density and higher-energy density and has higher durability under frequent charge and discharge, compared with the lead storage battery 20. Both the lead storage battery 20 and the lithium storage battery 30 are formed by connecting a plurality of battery cells in series. However, the inexpensive lead storage battery 20 has storage capacity larger than that of the lithium storage battery 30. Supplying electric power from the lead storage battery 20 having large capacity to the starter motor 41 requiring high electric power can make the capacity of the lithium storage battery 30 smaller, thereby restraining cost increase.

In addition, the lead storage battery 20 is provided with a current sensor 21 and a voltage sensor 22. The current sensor 21 detects a current flowing from or flowing to the lead storage battery 20. The voltage sensor 22 detects a terminal voltage of the lead storage battery 20. The lithium storage battery 30 is provided with a current sensor 31 and a voltage sensor 32. The current sensor 31 detects a current flowing from or flowing to the lithium storage battery 30. The voltage sensor 32 detects a terminal voltage of the lithium storage battery 30. Detection values of the sensors are transmitted to an ECU (electronic control unit) 80 (battery system controller).

The ECU 80 is a battery system controller of the present embodiment, and is configured with a known microcomputer including a CPU and memories (ROMs, RAMs). The ECU 80 calculates SOCs (states of charge:the ratio of the actual amount of charge to the amount of charge at the time of full charge) of the lead storage battery 20 and the lithium storage battery 30 on the basis of the obtained detection values. The ECU 80 controls the battery system so that SOCs of the lead storage battery 20 and the lithium storage battery 30 fall within an appropriate range. The appropriate range of SOC is a range in which the storage battery does not become overdischarged or overcharged. For example, the appropriate range of SOC of the lead storage battery 20 is 88 to 92%, and the appropriate range of SOC of the lithium storage battery 30 is 35 to 80%. The ECU 80 controls the predetermined voltage Vreg of the alternator 10 and controls the operation of the MOS switch 50 so that the lead storage battery 20 and the lithium storage battery 30 do not become overdischarged or overcharged.

The voltage characteristic (relationship between open-circuit voltage and SOC) of the lithium storage battery 30 is set so that a terminal voltage of the lithium storage battery 30 becomes lower than that of the lead storage battery 20 when the lead storage battery 20 and the lithium storage battery 30 are used within the appropriate range of SOC. The voltage characteristic of the lithium storage battery 30 can be realized by selecting a combination of a positive-electrode active material, a negative-electrode active material, and an electrolytic solution. For example, the positive-electrode active material is selected from lithium-metal complex oxides such as $LiCoO_2$, $LiMn_2O_4$, $LiO_2$, $LiFePO_4$. The negative-electrode active material is selected from carbon, graphite, lithium titanate, an alloy containing Si or Cu, and the like. The electrolytic solution is selected from organic electrolyte.

The starter motor 41 starts the engine when the vehicle is is started by the driver or is automatically restarted. A rotating shaft of the starter motor 41 is connected with a crankshaft (not shown) of the engine. When the vehicle is started by the driver or is automatically restarted, the starter motor 41 is driven by being supplied with electric power from the lead storage battery 20 to apply initial rotation to the crankshaft of the engine.

The electrical load 43 is a constant-voltage requiring electrical load which is required that the voltage of supply power is approximately contact or is stable so as to fluctuate at least within a predetermined range. Concrete examples of the electrical load 43 include a navigation system and an audio device. For example, if the voltage of supply power is not constant but fluctuates considerably, or the voltage of supply power fluctuates considerably outside the predetermined range, operation of a navigation system or the like may be reset when the voltage has decreased below the minimum operating voltage. To solve this problem, the electric power supplied to the electrical load 43 is required to have the voltage stabilized at a constant value which does not decrease below the minimum operating voltage.

The electrical load 42 is a general electrical load other than the electrical load 43 and the starter motor 41. Concrete examples of the electrical load 42 include headlights, wipers for a front windshield or the like, a blower fan an air conditioner, or a heater for a defroster of a rear windshield.

The MOS switch 50 is a semiconductor switch including two MOSFETs (metal-oxide semiconductor field-effect transistors). The MOS switch 50 is provided between a set of the alternator 10, the starter motor 41, the electrical load 42 and the lead storage battery 20, and a set of the electrical load 43 and the SMR switch 60. Hence, in a state where the SMR switch 60 is in an electrically conducting state (on state), the MOS switch 50 functions as a switch for switching between an electrically conducting state (on state) and an interrupted state (off state) between the set of the alternator 10, the starter motor 41, the electrical load 42 and the lead storage battery 20, and the set of the electrical load 43 and the lithium storage battery 30. The ECU 80 switches between an on state (electrically conducting state) and an off state (interrupted state) of the MOS switch 50.

In addition, the two MOSFETs are connected to each other in series so that parasitic diodes thereof are opposite in direction to each other. Hence, when the two MOSFETs are turned off, the current flowing through the parasitic diodes can completely be interrupted. As a result, if the two MOSFETs are turned off, both cases can be avoided where a current is discharged from the lithium storage battery 30 side to the lead storage battery 20 side and where a current is charged from the lead storage battery 20 side to the lithium storage battery 30 side.

The SMR switch 60 is, as well as the MOS switch 50, a semiconductor switch including two MOSFETs. The SMR switch 60 is provided between the lithium storage battery 30 and a set of the MOS switch 50 and the electrical load 43. In a state where the MOS switch 50 is turned on, the MOS switch 60 functions as a switch for switching between an electrically conducting state (on state) and an interrupted state (off state) between the lithium storage battery 30 and the set of the alternator 10 and the electrical loads 42, 43. That is, the SMR switch 60 functions as an emergency switch which detaches the lithium storage battery 30 from the battery system when abnormity has occurred in the battery system.

Switching between an on state (electrically conducting state) and an off state (interrupted state) performed by the SMR switch 60 is controlled by the ECU 80. In normal time, the SMR switch 60 is held in an on state by continuously receiving an on signal from the ECU 80. In abnormal time, output of the on signal from the ECU 80 is stopped to switch the SMR switch 60 to an off state, whereby the lithium storage battery 30 is protected. Concrete examples of abnormal states include a fault of the alternator 10 and a disconnection of a wiring connecting the alternator 10 and the lithium storage battery 30.

The relay switch 70 is provided on a bypass 71 connecting both sides of MOS switch 50. The relay switch 70 is a normally closed electromagnetic relay. The relay switch 70 is an emergency electrically conducting means used when an abnormality (fault) has occurred in the MOS switch 50 or the ECU 80. In normal time (non-fault time), the relay switch 70 has become in an off state by receiving an excitation current from the ECU 80. For example, if an abnormality occurs in the ECU 80, whereby the ECU 80 cannot output an on signal to the MOS switch 50 and cannot output an excitation current to the relay switch 70, the relay switch 70 is switched to an on state. Hence, since electric conduction is established in the bypass 71, the electrical load 43 can be supplied with electric power from at least one of the alternator 10 and the lead storage battery 20 via the bypass 71.

Note that the lithium storage battery 30, the MOS switch 50, the SMR switch 60, the relay switch 70 and the ECU 80 are integrally housed in a storage case, which forms a battery unit U.

Next, an operation is described in which an on state and an off state of the MOS switch 50 are switched according to a driving situation of the engine. Note that, as described above, the SMR switch 60 is held in an on state in normal time.

Figure 2:
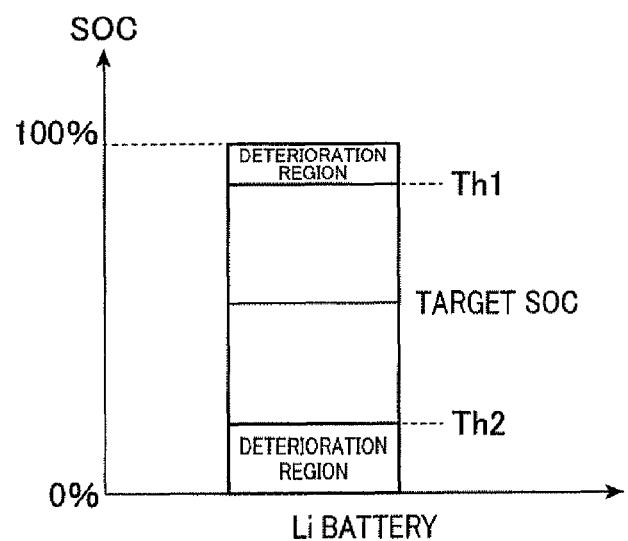
FIG. 2 is a view showing an operating region of state of charge (SOC) of a lithium storage battery.

When electricity is generated, not using regeneration, at the time, for example, when the vehicle is stably running, accelerating, or idling, the ECU 80 switches an on state and an off state of the MOS switch 50 according to SOC of the lithium storage battery 30. FIG. 2 shows an operating region of SOC of the lithium storage battery 30. The range between an upper threshold value Th1 and a lower threshold value Th2 is an appropriate range in which SOC of the lithium storage battery 30 does not become overdischarge and overcharge. Within the range between the upper threshold value Th1 and the lower threshold value Th2, target SOC (target amount of charge) of the lithium storage battery 30 while the engine is driven is set. Note that the upper threshold value Th1, the lower threshold value Th2, and the target SOC are set so as to be different between the time when SOC increases and the time when SOC decreases and due to the state of the engine, to avoid hunting of the MOS switch 50.

If SOC of the lithium storage battery 30 is smaller than the target SOC, the ECU 80 switches on the MOS switch 50. If the terminal voltage of the lithium storage battery 30 is controlled so as to be smaller than the terminal voltage of the lead storage battery 20, the lithium storage battery 30 is charged from the alternator 10 or the lead storage battery 20. If SOC of the lithium storage battery 30 becomes larger than the target SOC, the ECU 80 turns off the MOS switch 50, thereby prohibiting the lithium storage battery 30 from being charged, and allowing discharge of the lithium storage battery 30 to the electrical load 43. In this case, electric power is supplied from the alternator 10 or the lead storage battery 20 to the electrical load 42.

In addition, while deceleration regeneration is performed, the ECU 80 turns on the MOS switch 50. When deceleration regeneration is performed, if SOC of the lithium storage battery 30 is smaller than the upper threshold value Th1, the ECU 80 turns on the MOS switch 50 even if SOC of the lithium storage battery 30 is larger than the target SOC. If the terminal voltage of the lithium storage battery 30 is controlled so as to be smaller than the terminal voltage of the lead storage battery 20, electric power generated by deceleration regeneration is mainly charged into the lithium storage battery 30. Then, if SOC of the lithium storage battery 30 has become larger than the upper threshold value Th1, the ECU 80 turns off the MOS switch 50 to prevent the lithium storage battery 30 from being overcharged. Hence, the range from the target SOC to the upper threshold value Th1 is used as a margin for regeneration. Note that part of electric power generated by deceleration regeneration is consumed by the electrical loads 42, 43, and another part of the electric power is charged into the lead storage battery 20.

In addition, when the vehicle is automatically stopped by the idle reduction function, the ECU 80 switches the MOS switch 50 to an off state. Hence, the electrical load 42 is supplied with electric power is from the lead storage battery 20, and the electrical load 43 is supplied with electric power from the lithium storage battery 30. In a state where the MOS switch 50 is turned off, the ECU 80 automatically restarts the engine. Since the starter motor 41 and the lithium storage battery 30 are in an interrupted state, and the starter motor 41 and the lead storage battery 20 are in an electrically conducting state, the starter motor 41 is driven by being supplied with electric power from the lead storage battery 20. Hence, discharging the lithium storage battery 30 to the starter motor 41, which consumes high electric power, is not performed, thereby preventing the lithium storage battery 30 from being overdischarged. In addition, while the vehicle is automatically stopped by the idle reduction function, if the SOC of the lithium storage battery 30 becomes smaller than the lower threshold value Th2, the ECU 80 restarts the engine to turn on the MOS switch 50, thereby charging the lithium storage battery 30.

If the terminal voltage of the lithium storage battery 30 is controlled so as to be smaller than the terminal voltage of the lead storage battery 20, when the MOS switch 50 is turned on, charging current always flows from the alternator 10 or the lead storage battery 20 to the lithium storage battery 30. In a state where charging current is flowing to the lithium storage battery 30, if the MOS switch 50 is switched from an on state to an off state, charging current is received by the lead storage battery 20, thereby increasing the charging current flowing to the lead storage battery 20.

Figure 3:
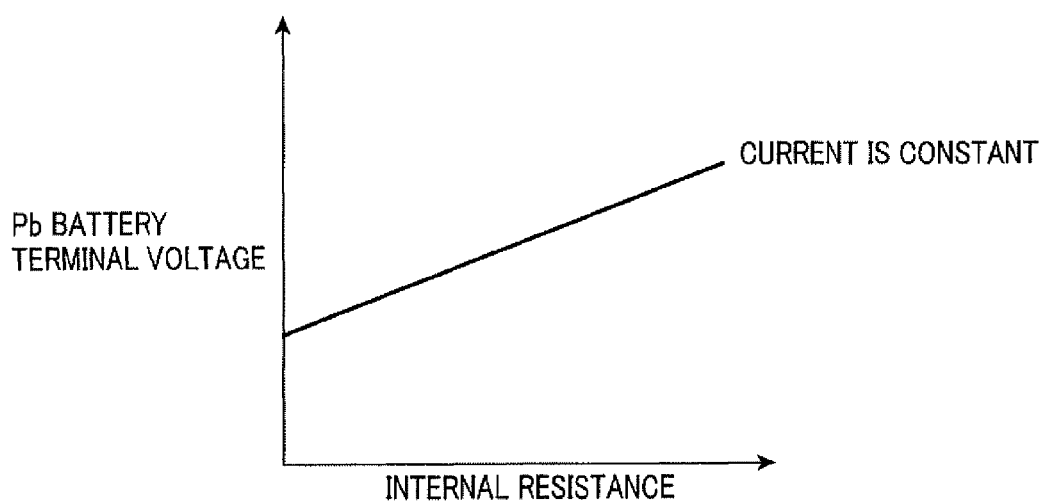
FIG. 3 is a view showing a relationship between terminal voltage and internal resistance of a lead storage battery at the time of charge.

The terminal voltage of a storage battery at the time of charge is expressed by the following expression:

$$Vc = Vo + R \times Ic$$

where Vc is a terminal voltage a storage battery at the time of charge, Vo is an open-circuit voltage, R is an internal resistance, and Ic is a charging current. The open-circuit voltage Vo is a voltage obtained when no current is flowing to the storage battery. Hence, as shown in FIG. 3, provided that the charging current is constant, the terminal voltage of the lead storage battery 20 increases as the charging current increases. Hence, if the MOS switch 50 is switched from an on state to an off state in a state where charging current is flowing to the lithium storage battery 30, the terminal voltage of the lead storage battery 20 significantly increases as the internal resistance of the lead storage battery 20 and the amount of increase of the charging current flowing to the lead storage battery 20 become larger. If the amount of increase of the terminal voltage of the lead storage battery 20 becomes larger, the terminal voltage of the lead storage battery 20 exceeds withstand voltages of the electrical loads 42, 43, which can damage the electrical loads 42, 43.

Figure 4:
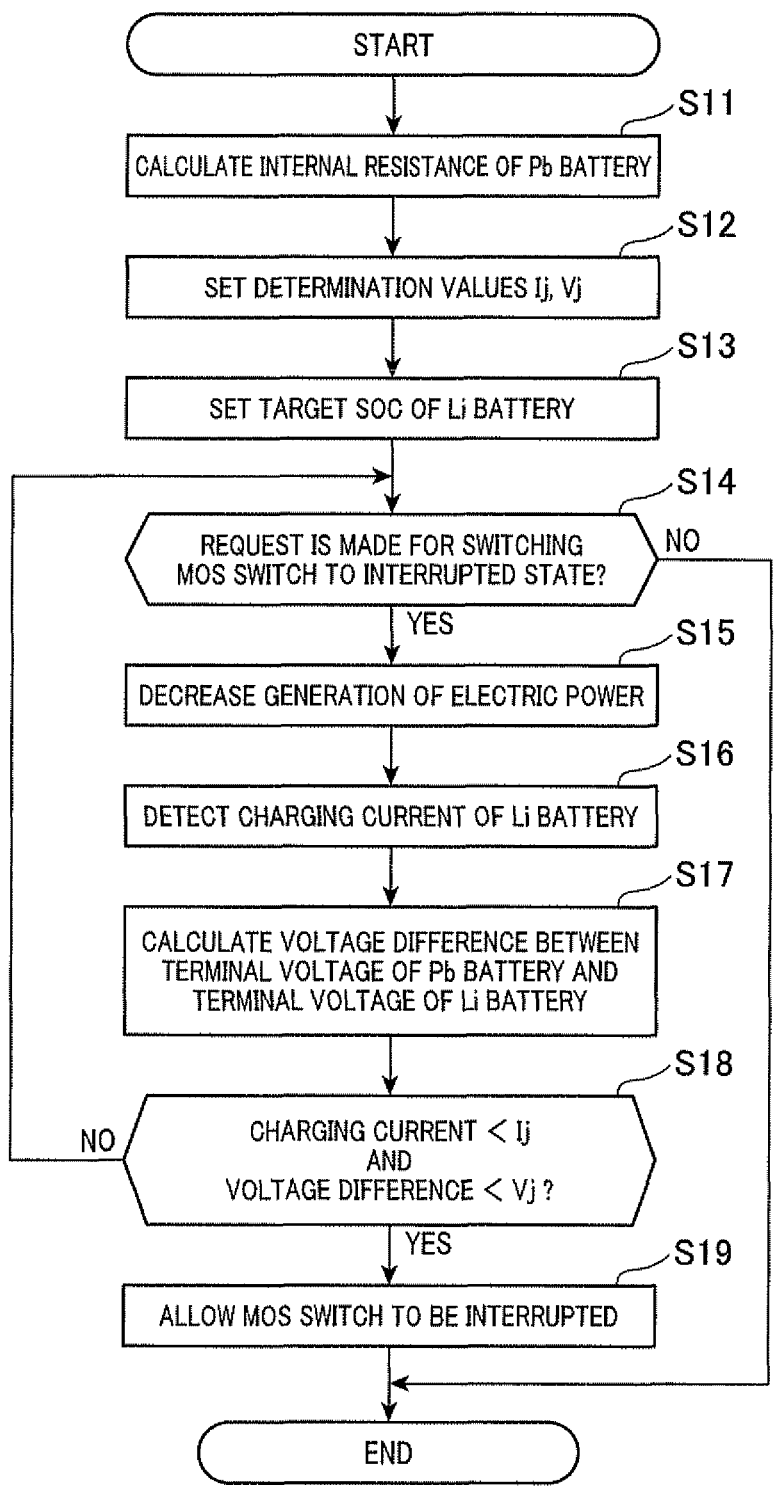
FIG. 4 is a flowchart showing a procedure for allowing a MOS switch to be switched from an electrically conducting state to an interrupted state.

To solve the above problem, on the condition that the charging current flowing to the lithium storage battery 30 is small, the MOS switch 50 is allowed to be switched from an on state to an off state. FIG. 4 shows a procedure for allowing the MOS switch 50 to be switched from an electrically conducting state to an interrupted state. The procedure is repeatedly performed by the ECU 80 at specified time intervals during one trip.

First, in S11, the ECU 80 calculates an internal resistance of the lead storage battery 20. The internal resistance becomes larger as the lead storage battery 20 further deteriorates and the temperature becomes lower. For example, the internal resistance is calculated on the basis of the amount of voltage drop of the lead storage battery 20 detected when the starter motor 41 is driven. The terminal voltage of a storage battery at the time of discharge is expressed by the following expression:

$$Vd = Vo - R \times Id$$

where Vd is a terminal voltage of the storage battery at the time of discharge, and Id is a discharging current. The amount of voltage drop at the time of discharge is determined by the internal resistance and discharging current. Since an approximately constant current flows from the lead storage battery 20 to the starter motor 41 when the starter motor 41 is driven, the amount of voltage drop of the lead storage battery 20 when the starter motor 41 is driven largely depends on the internal resistance of the lead storage battery 20. Hence, the internal resistance of the lead storage battery 20 can be calculated from the amount of voltage drop of the lead storage battery 20 when the starter motor 41 is driven. Note that the internal resistance of the lead storage battery 20 is calculated from the same detection value until the engine automatically restarts after the engine stops.

Next, in S12, a determination value Ij is set which is for determining whether or not charging current flowing to the lithium storage battery 30 is smaller. If the detection value of the charging current flowing to the lithium storage battery 30 is smaller than the determination value Ij, the ECU 80 assumes that the charging current is smaller. Thus, the determination value Ij is set so that the current received by the lead storage battery 20 becomes smaller when the MOS switch 50 is switched from an electrically conducting state to an interrupted state, as the internal resistance of the lead storage battery 20 becomes larger, that is, so that the amount of increase of the terminal voltage of the lead storage battery 20 is restricted even when the internal resistance of the lead storage battery 20 is larger. Hence, the larger the internal resistance of the lead storage battery 20 calculated in S11, the smaller the determination value Ij is set.

Furthermore, in S12, another determination value Vj is set which is for determining whether or not charging current flowing to the lithium storage battery 30 is smaller. The charging current flowing from the lead storage battery 20 to the lithium storage battery 30 becomes larger as the voltage difference between the terminal voltage of the lead storage battery 20 and the terminal voltage of the lithium storage battery 30 becomes larger. That is, the larger the voltage difference between the terminal voltage of the lead storage battery 20 and the terminal voltage of the lithium storage battery 30, the larger the charging current flowing to the lithium storage battery 30 can be assumed to be. Hence, if the voltage difference calculated from the terminal voltage of the lead storage battery 20 and the terminal voltage of the lithium storage battery 30 is smaller than the determination value Vj, the charging current flowing to the lithium storage battery 30 is assumed to be smaller. Therefore, as in the case of the determination value Ij, the larger the internal resistance of the lead storage battery 20 calculated in S11, the smaller the determination value Ij is set.

Next, in S13, the larger the internal resistance of the lead storage battery 20 calculated in S11, the higher the target SOC of the lithium storage battery 30 (the larger the target amount of charge) is set. The terminal voltage of the lithium storage battery 30 is correlated to SOC of the lithium storage battery 30. The higher SOC, the higher the terminal voltage of the lithium storage battery 30 becomes. In addition, the higher the terminal voltage of the lithium storage battery 30, the smaller the charging current flowing from the lead storage battery 20 to the lithium storage battery 30 becomes. That is, the higher SOC of the lithium storage battery 30, the smaller the charging current flowing from the lead storage battery 20 to the lithium storage battery 30 becomes.

Next, in S14, the ECU 80 determines whether or not a request has made for switching the MOS switch 50 from an electrically conducting state to an interrupted state. If the request has not been made (NO), the present process is ended. If the request has been made (YES), the process proceeds to S15.

In S15, the ECU 80 decreases electric power generated by the alternator 10 so that charging current flowing to the lithium storage battery 30 becomes smaller than the determination value Ij.

Next, in S16, charging current flowing to the lithium storage battery 30 is detected by the current sensor 31.

Next, in S17, terminal voltage of the lead storage battery 20 and terminal voltage of the lithium storage battery 30 are detected by the voltage sensor 22 and the voltage sensor 32. Then, the ECU 80 calculates the voltage difference between the terminal voltage of the lead storage battery 20 and the terminal voltage of the lithium storage battery 30.

Next, in S18, the ECU 80 determines whether or not the charging current detected in S16 is smaller than the determination value Ij set in S12 and whether or not the voltage difference calculated in S17 is smaller than the determination value Vj set in S12. By performing the two determinations whether or not the conditions are met that the charging current flowing to the lithium storage battery 30 is smaller, reliability of the determinations is improved.

If the charging current detected in S16 is smaller than the determination value Ij, and the voltage difference calculated in S17 is smaller than the determination value Vj (YES), the process proceeds to S19. In other cases (NO), the process returns to S14, and repeats S14 to S18 until positive determination is done in S18.

Next, in S19, switching the MOS switch 50 from an electrically conducting state to an interrupted state is allowed. On the condition that charging current flowing to the lithium storage battery 30 is smaller, switching the MOS switch 50 from an electrically conducting state is allowed. Hence, the current received by the lead storage battery 20 can be controlled to be smaller when the MOS switch 50 is switched from an electrically conducting state to an interrupted state. Then, the present process is ended.

The above-described embodiment can provide the following advantages.

Switching the MOS switch 50 from an electrically conducting state to an interrupted state is allowed, on the condition that the detection value of the charging current flowing to the lithium storage battery 30 is smaller, the voltage difference calculated from the terminal voltage of the lead storage battery 20 and the terminal voltage of the lithium storage battery 30 is smaller than the determination value Vj. In addition, the larger the internal resistance of the lead storage battery 20, the smaller the determination values Ij, Vj are set. Hence, when the MOS switch 50 is switched from an electrically conducting state to an interrupted state, the current received by the lead storage battery 20 becomes smaller as the internal resistance becomes larger. Hence, when interrupting between the lithium storage battery 30, and the alternator 10, the electrical loads 42, 43, and the lead storage battery 20, the amount of increase of the terminal voltage of the lead storage battery 20 can be restrained.

When a request is made for switching the MOS switch 50 from an electrically conducting state to an interrupted state, if electric power generated by the alternator 10 is decreased, charging current flowing from the alternator 10 to the lithium storage battery 30 decreases. Hence, charging current flowing to the lithium storage battery 30 decreases, which can easily allow the MOS switch 50 to be switched from an electrically conducting state to an interrupted state.

If the target SOC of the lithium storage battery 30 is set higher, SOC of the lithium storage battery 30 is easily kept at a higher charge level (a state where the amount of charge is larger), whereby charging current flowing from the lead storage battery 20 to the lithium storage battery 30 can be controlled to be smaller. Hence, the larger the internal resistance of the lead storage battery 20, the smaller the charging current flowing from the lead storage battery 20 to the lithium storage battery 30 can set at. Furthermore, a current received by the lead storage battery 20 when the MOS switch 50 is switched from an electrically conducting state to an interrupted state can be controlled so as to be smaller.

By setting the target SOC of the lithium storage battery 30 higher, and decreasing electric power generated by the alternator 10, charging current flowing from the alternator 10 and the lead storage battery 20 to the lithium storage battery 30 can be controlled so as to be smaller. Furthermore, a current received by the lead storage battery 20 when the MOS switch 50 is switched from an electrically conducting state to an interrupted state can reliably be controlled so as to be smaller.

It will be appreciated that the present invention is not limited to the configurations described above, but any and all modifications, variations or equivalents, which may occur to those who are skilled in the art, should be considered to fall within the scope of the present invention.

Only by comparing a detection value detected by the current sensor 31 with the determination value Ij, it may be determined that charging current flowing to the lithium storage battery 30 is smaller. This can also determine that charging current flowing to the lithium storage battery 30 is smaller.

The voltage difference between the terminal voltage of the lead storage battery 20 and the terminal voltage of the lithium storage battery 30 may optionally not be calculated. Alternatively, it may be simply assumed that charging current flowing to the lithium storage battery 30 becomes larger as the terminal voltage of the lead storage battery 20 becomes higher. Hence, the process for determining whether or not charging current flowing to the lithium storage battery 30 is smaller can be simplified.

The voltage difference between the terminal voltage of the lead storage battery 20 and the terminal voltage of the lithium storage battery 30 may optionally not be calculated. Alternatively, it may be simply assumed that charging current flowing to the lithium storage battery 30 becomes larger as the terminal voltage of the lithium storage battery 30 becomes lower. Hence, the process for determining whether or not charging current flowing to the lithium storage battery 30 is smaller can be simplified.

As a high performance storage battery having high-power density and high-energy density, a nickel storage battery, a capacitor, and an AGM (Absorbent Glass Mat) storage battery may be employed.

In the above embodiments, as the MOS switch 50 and the SMR switch 60, a semiconductor switch formed of a PIN diode or a thyristor, a solid state relay, an electromagnetic relay or the like may be employed.

The electrical load 42 may be connected between the MOS switch 50 and the SMR switch 60 together with the electrical load 43. According to this configuration, when the MOS switch 50 is turned off, electric power is supplied from the lithium storage battery 30 to the electrical loads 42, 43.

The battery system according to the above embodiments may be installed in a vehicle which does not have an idle reduction function.

Hereinafter, aspects of the above-described embodiments will be summarized.

As an aspect of the embodiment, a battery system controller (80) is provided which is used for a battery system including a generator (10) which is driven by an output shaft of an engine to generate electricity, electrical loads (42, 43) which are connected to the generator in parallel, a lead storage battery (20) which is connected to the generator in parallel so as to be charged with electric power generated by the generator, a high performance storage battery (30) which has higher-power density and higher-energy density and is connected to the generator in parallel so as to be charged with electric power generated by the generator and electric power discharged from the lead storage battery, and an opening and closing switch (50) which switches the generator and the lead storage battery, and the high performance storage battery to an electrically conducting state or an interrupted state, a terminal voltage of the high performance storage battery being controlled so as to be lower than a terminal voltage of the lead storage battery. The battery system controller includes a control unit which allows the opening and closing switch to switch from an electrically conducting state to an interrupted state on the condition that charging current flowing to the high performance storage battery is smaller than a determination value, and the larger an internal resistance of the lead storage battery, the smaller the determination value is set.

The battery system controller is used in the battery system in which the generator, the electrical loads and the lead storage battery, to and the high performance storage battery are connected via the opening and closing switch and are connected to each other in parallel. According to the battery system, since the terminal voltage of the high performance storage battery is controlled so as to be lower than the terminal voltage of the lead storage battery, a charging current flows from the generator or the lead storage battery to the high performance storage battery when the generator and the lead storage battery, and the high performance storage battery are in an electrically conducting state. Then, if the opening and closing switch is switched from an electrically conducting state to an interrupted state while a charging current is flowing to the high performance storage battery, the charge current is received by the lead storage battery. Hence, the amount of current flowing to the lead storage battery increases, which rapidly increases the terminal voltage of the lead storage battery. The amount of increase of the terminal voltage of the lead storage battery becomes larger as the internal resistance of the lead storage battery and the amount of increase of the current flowing to the lead storage battery become larger. If the amount of increase of the terminal voltage of the lead storage battery become larger, the terminal voltage of the lead storage battery exceeds withstand voltages of the electrical loads, which can damage the electrical loads.

However, according to the above battery system controller, the opening and closing switch is allowed to be switched from an electrically conducting state to an interrupted state on the condition that charging current flowing to the high performance storage battery is smaller than a determination value. The larger the internal resistance of the lead storage battery, the smaller the determination value is set. Hence, when the opening and closing switch is switched from an electrically conducting state to an interrupted state, the current received by the lead storage battery becomes smaller as the internal resistance is larger. Therefore, when interrupting between the high performance storage battery, and the generator, the electrical loads and the lead storage battery, the amount of increase of the terminal voltage of the lead storage battery can be restrained.

What is claimed is:

1. A battery system controller, which is used for a battery system including a generator which is driven by an engine to generate electricity, electrical loads which are connected to the generator in parallel, a lead storage battery which is connected to the generator in parallel so as to be charged with electric power generated by the generator, a high performance storage battery which has higher-power density and higher-energy density than the lead storage battery and is connected to the generator in parallel so as to be charged with electric power generated by the generator and electric power discharged from the lead storage battery, and an opening and closing switch which switches the generator and the lead storage battery, and the high performance storage battery to an electrically conducting state or an interrupted state, a terminal voltage of the high performance storage battery being controlled so as to be lower than a terminal voltage of the lead storage battery, comprising:
a control unit which allows the opening and closing switch to switch on (a) a first condition that charging current flowing to the high performance storage battery is smaller than a predetermined current corresponding to a current determination value (Ij), (b) even if the opening and closing switch is switched from an electrically conducting state to an interrupted state in a state where the predetermined current is flowing to the high performance storage battery, the terminal voltage of the lead storage battery does not exceed a withstand voltage of the electrical load, (c) a second condition that the terminal voltage of the lead storage battery is smaller than a voltage determination value (Vj), (d) if the first condition and the second condition are met, the control unit allows the opening and closing switch to switch from the electrically conducting state to the interrupted state, and (e) the larger an internal resistance of the lead storage battery is, the smaller the current determination value (Ij) is set.

2. The battery system controller according to claim 1, wherein if a request is made for switching the opening and closing switch from an electrically conducting state to an interrupted state, the control unit decreases electric power generated by the generator so that the charging current becomes smaller than the current determination value.

3. The battery system controller according to claim 1, wherein
the control unit sets a target amount of charge of the high performance storage battery while the engine is being driven, so as to be larger as the internal resistance of the lead storage battery becomes larger, within an appropriate range in which the high performance storage battery does not become overdischarged or overcharged.

4. The battery system controller according to claim 1, wherein
the larger the voltage difference between the terminal voltage of the lead storage battery and the terminal voltage of the high performance storage battery, the larger the charging current is assumed to be.

5. The battery system controller according to claim 1, wherein
the higher the terminal voltage of the lead storage battery, the larger the charging current is assumed to be.

6. The battery system controller according to claim 1, wherein
the lower the terminal voltage of the high performance storage battery, the larger the charging current is assumed to be.

7. The battery system controller according to claim 1, wherein
the battery system includes a starter motor which is connected to the lead storage battery in parallel and is driven by being supplied with electric power from the lead storage battery, and
the control unit calculates the internal resistance of the lead storage battery on the basis of an amount of voltage drop of the lead storage battery when the starter motor is driven.

8. The battery system controller according to claim 1, wherein the voltage determination value is set based on a terminal voltage of the lead storage battery that exceeds a withstand voltage of the electrical loads.

9. A battery system controller, which is used for a battery system including a generator which is driven by an engine to generate electricity, electrical loads which are connected to the generator in parallel, a lead storage battery which is connected to the generator in parallel so as to be charged with electric power generated by the generator, a high performance storage battery which has higher-power density and higher-energy density than the lead storage battery and is connected to the generator in parallel so as to be charged with electric power generated by the generator and electric power discharged from the lead storage battery, and an opening and closing switch which switches the generator and the lead storage battery, and the high performance storage battery to an electrically conducting state or an interrupted state, a terminal voltage of the high performance storage battery being controlled so as to be lower than a terminal voltage of the lead storage battery, comprising: a control unit which allows the opening and closing switch to switch on (a) a first condition that charging current flowing to the high performance storage battery is smaller than a predetermined current corresponding to a current determination value (Ij), (b) even if the opening and closing switch is switched from an electrically conducting state to an interrupted state in a state where the predetermined current is flowing to the high performance storage battery, the terminal voltage of the lead storage battery does not exceed a withstand voltage of the electrical load, (c) a second condition that a voltage difference between the terminal voltage of the lead storage battery and the terminal voltage of the high performance storage battery is smaller than a predetermined voltage difference corresponding to a voltage determination value (Vj), (d) if the first condition and the second condition are met, the control unit allows the opening and closing switch to switch from the electrically conducting state to the interrupted state, and (e) the larger an internal resistance of the lead storage battery is, the smaller the current determination value (Ij) and the voltage determination value (Vj) are set.

10. The battery system controller according to claim 9, wherein if a request is made for switching the opening and closing switch from an electrically conducting state to an interrupted state, the control unit decreases electric power generated by the generator so that the charging current becomes smaller than the current determination value.

11. The battery system controller according to claim 9, wherein
the control unit sets a target amount of charge of the high performance storage battery while the engine is being driven, so as to be larger as the internal resistance of the lead storage battery becomes larger, within an appropriate range in which the high performance storage battery does not become overdischarged or overcharged.

12. The battery system controller according to claim 9, wherein
the larger the voltage difference between the terminal voltage of the lead storage battery and the terminal voltage of the high performance storage battery, the larger the charging current is assumed to be.

13. The battery system controller according to claim 9, wherein
the higher the terminal voltage of the lead storage battery, the larger the charging current is assumed to be.

14. The battery system controller according to claim 9, wherein
the lower the terminal voltage of the high performance storage battery, the larger the charging current is assumed to be.

15. The battery system controller according to claim 9, wherein
the battery system includes a starter motor which is connected to the lead storage battery in parallel and is driven by being supplied with electric power from the lead storage battery, and
the control unit calculates the internal resistance of the lead storage battery on the basis of an amount of voltage drop of the lead storage battery when the starter motor is driven.

16. The battery system controller according to claim 9, wherein the voltage determination value is set based on a terminal voltage of the lead storage battery that exceeds a withstand voltage of the electrical loads.

* * * * *